(12) United States Patent
Balistreri et al.

(10) Patent No.: US 6,255,881 B1
(45) Date of Patent: Jul. 3, 2001

(54) HIGH TUNABILITY CMOS DELAY ELEMENT

(75) Inventors: Emanuele Balistreri, Battipaglia; Marco Burzio, Turin, both of (IT)

(73) Assignee: Cselt- Centro Studi E Laboratori Telecomunicazioni S.p.A., Turin (IT)

( * ) Notice: Subject to any disclaimer, the term of this patent is extended or adjusted under 35 U.S.C. 154(b) by 0 days.

(21) Appl. No.: 09/441,775

(22) Filed: Nov. 17, 1999

(30) Foreign Application Priority Data

Nov. 26, 1998 (IT) .............................. TO98A0993

(51) Int. Cl.$^7$ ...................................... H03K 5/13
(52) U.S. Cl. ........................ 327/280; 327/274; 327/287
(58) Field of Search .................................. 327/266, 276, 327/280, 281, 285, 287, 288, 274

(56) References Cited

U.S. PATENT DOCUMENTS 5,714,912 * 2/1998 Fiedler et al. ........................ 331/57
5,994,939 * 11/1999 Johnson et al. ...................... 327/280
6,043,719 * 3/2000 Lin et al. .............................. 331/57

OTHER PUBLICATIONS

"Monolithic Phase–Locked Loops and Clock Recovery Circuits", Theory and Design, B.Razavi, Institute of Electrical and Electronics Engineers, Inc.New York 1996, 39 pages.

* cited by examiner

*Primary Examiner*—Tuan T. Lam
(74) *Attorney, Agent, or Firm*—Herbert Dubno

(57) ABSTRACT

The delay element consists of a differential amplifier (M15, M8, M2, M6, M5) in which the load transistors (M2, M5) are associated to respective gate biasing transistors (M21, M22) connected in a source follower configuration, and to feedback transistors (M3, M4), which implement a negative impedance in parallel to a positive impedance represented by each of the load transistors (M2, M5). The modulation of the delay is achieved by modulating the bias currents of the load transistors (M2, M5), the feedback transistors (M3. M4) and the gate biasing transistors (M21, M22).

3 Claims, 2 Drawing Sheets

HIGH TUNABILITY CMOS DELAY ELEMENT

FIELD OF THE INVENTION

This invention relates to CMOS analog integrated circuits and in particular to a method for extending the tuning range of a delay element forming a part of such a circuit and destined to be used for the implementation of ring oscillators or of delay lock circuits. The invention relates also to the high tunability delay element so obtained.

BACKGROUND OF THE INVENTION

In the essence, a delay element is formed by an amplification element, in order not to attenuate the signal, and by a load reproducing the input voltage at its output. The delay depends on the time required by the amplifier to reproduce the input voltage on the load.

In the most common applications, a plurality of these elements is connected in cascade to form a controlled delay line or a ring oscillator. In the design of this type of device, utmost importance is devoted to the choice of the structure of the basic block that implements the delay and amplification. The most usual choice is to use structures based on differential amplifiers, since their use allows reducing the effects of the noises that add to the signal in a common mode due to capacitive couplings. Further, the element chosen must allow a variability of the delay introduced, to allow the implementation of tuneable delay lines or ring oscillators.

When facing the tunability issue, one has to overcome definitively the problem of the spread of the characteristics of the different specimen (i.e. the spread being due to variations in the process conditions for the implementation of the individual specimen), in addition to the extreme sensitivity of the components to operating conditions (power supply voltage and temperature). The device must therefore exhibit a high flexibility in order that all the requirements may be met as the operating and process conditions vary. In particular, the tunability range of the individual delay element shall have to ensure at least the achievement of a delay of interest (and therefore, in the case of a tuneable oscillator, of an oscillation frequency of interest), whatever the operating and process conditions might be.

So far various delay elements of differential structures have been suggested for achieving the above-cited targets.

The document "Design of Monolithic Phase-Locked Loops and Clock Recovery Circuits—A Tutorial", by B. Razavi, published on page 1 and ff. of the book "Monolithic phase-locked loops and clock recovery circuits—Theory and Design", edited by B. Razavi and published by The Institute of Electrical and Electronics Engineers, Inc., New York (USA), 1996, discloses a CMOS circuit substantially consisting of a differential amplifier in which the gates of the load transistors are biased by respective source follower stages so as to compensate for the gate-source voltage drops of the transistors and allow the operation at the low voltage values commonly used in CMOS technology. The transistors of the source follower stages are biased by a constant current. The delay modulation is obtained by modulating the rest current that flows through a pair of N type transistors that introduce a local positive feedback and that, for the small signals involved, form each a negative impedance in parallel to the positive impedance of the load P type transistors. To guarantee the constancy of the oscillation amplitude, the rest current in the load transistors is kept constant, and this may be achieved by driving the current mirrors that supply the differential stage and the feedback stage in such a way as to obtain a constant sum of respective currents. The document states that the circuit, when used in an oscillator, has a tunability range of about an octave (i.e. a maximum frequency about twice the minimum frequency). This bound is set by the fact that the transconductance of the feedback transistors cannot exceed that of the load transistors, to ensure that the total impedance of the load (resulting from the parallel connection between the positive impedance of the load transistor and the negative impedance of the respective feedback transistor) will not become negative, thus making the circuit unstable.

A range of this size is insufficient by itself for the application in particular in oscillators to be used within integrated circuits, where a high flexibility is required (for instance oscillation frequencies ranging for instance from a hundred MHz to more than 1 GHz are to be achieved). Furthermore, it has been experienced in practice that the spread of the characteristics of the components due to the variations of the fabrication process and operating conditions causes fluctuations of the upper and lowers bounds of the tunability range of an amplitude comparable to the amplitude of the range itself, and this further reduces the range actually guaranteed.

SUMMARY OF THE INVENTION

According to the invention, there are provided a method of extending the tunability range of a CMOS delay element, based on a differential amplifier, and the delay element with an extended tunability range obtained through such a method.

The method of extending the tunability range of a CMOS delay element is based on a differential amplifier comprising load transistors that have a first type of doping and are associated with respective gate biasing transistors, connected in a source follower configuration and having a second type of doping and with feedback transistors, also having the second type of doping and forming a negative impedance in parallel to a positive impedance formed by each of the load transistors. The load transistors and the feedback transistors are biased by respective currents variable in opposite directions upon variation of the delay to be introduced. The transistors connected in source follower configurations are biased by a bias current that is also made to vary so as to cause decrease in the impedance of the load transistors, and the bias current of the load transistors is made to vary in such a way as to reach a maximum value higher than the maximum value of the bias currents of the feedback transistors, so that the sum of said biasd currents of the load transistors and of the feedback transistors increases in a substantially linear way as to be introduced decreases.

The CMOS delay element can comprise a differential amplifier in which a pair of load transistors having a first type of doping, are associated with respective gate biasing transistors, connected in a source follower configuration and having a second type of doping, and with feedback transistors that also have the second type of doping and form a negative impedance in parallel to a positive impedance represented by each of the load transistors. The load transistors and the feedback transistors are associated with respective generators of control voltages such as to allow flow through said transistors, respective bias currents which vary in order to achieve the variation of the delay to be introduced by the element. The transistors biasing the gates of the load transistors are also associated with a generator of control voltage arranged to cause flow in the bias transistors of a bias current which is variable and linearly increasing in order to reduce the positive impedance of the load transistors. Generators of control voltages for the load transistors and the feedback transistors are arranged to cause flow in such transistors of bias currents such that the bias current of the load transistors rise to a maximum value higher than the maximum value of the bias current of the feedback transistors so that the sum of the bias currents of the load transistors and feedback transistors increases in a substantially linear way as the delay to be introduced decreases.

A delay line for a ring oscillator or a delay lock circuit comprises a cascade of CMOS delay elements with high tunability ranges as described.

BRIEF DESCRIPTION OF THE DRAWING

For the sake of better clarity, reference is made to the attached drawing, in which.

SPECIFIC DESCRIPTION

Figure 1:
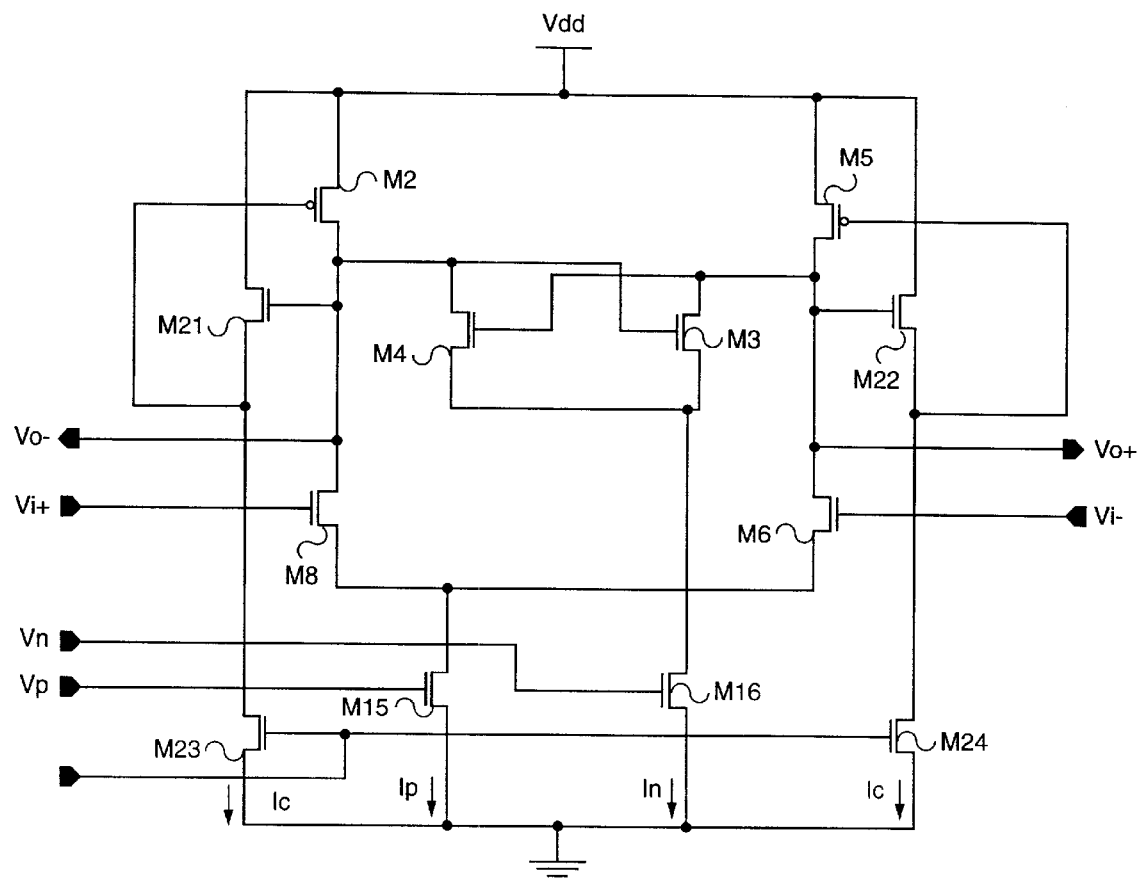
FIG. 1 is the circuit diagram of the delay element.

The delay element according to the invention is depicted in FIG. 1. The diagram therein is substantially identical to the one described in the above cited document by B. Razavi (see in particular FIG. 35) and differs in the way the bias of the load and feedback transistors is obtained, that is a particular feature of the invention and results in a wider tunability range.

That being stated, the delay element comprises a conventional differential amplifier formed by the transistors M8, M6, M15 (of N type) and M2, M5 (of P type), in which the two P transistors form the load.

The signal to be delayed is applied to the gates of the two transistors M6, M8 (Vi− and Vi+, respectively) and the output voltage is present at the point common to the drains of the transistors M1, M6 and M2, M8 (Vo− and Vo+, respectively). Transistor M15 is the bias transistor of the amplifier and a variable control voltage is applied to its gate and generates a variable drain current lp which when added to a variable current ln supplied by a pair of feedback transistors M3, M4, represents the bias current of the differential stage (in particular the bias current of the load transistors).

The feedback transistors M3, M4 (they, too, of N type) have their gates connected to the drains of M5 and M2, respectively, and form a negative impedance Z2 which is set in parallel to the load transistors M2, M5. The two transistors M3, M4 are biased by a transistor M16, to the gate of which a variable control voltage Vn is applied which originates the variable drain current in forming the bias current of feedback transistors M3, M4.

Additionally, the load transistors M2, M5 are associated with respective transistors M21. M22, biased by the transistors M23, M24, which implement two source follower stages. The latter transistors have the task of correctly biasing the gates of load transistors M2, M5, thus reproducing at the gates of these transistors the same voltage variations as those occurring at their drains, but with a lower rest voltage, in order to increase the upper limit of the output voltage up to a value almost equal to the power supply voltage, without affecting the correct operation of the system. Reference lc denotes the drain current of the transistors M23, M24 (bias current of transistors M21, M22 of the source follower stages) obtained starting from a control voltage Vc applied to the gate of M23, M24.

According to the invention, in order to extend the delay (or frequency) tunability range, in addition to causing the variation of lp, in, also bias current lc of transistors M21, M22 (drain current of M23 or M249) is caused to vary, in such a way as to increase as the delay decreases. Furthermore, the modulation of the currents lp, ln is no longer effected starting from a common control voltage (as in the known technique), but in an independent way, so that the sum of the current in the feedback transistors and in the load transistors linearly increases and is no longer constant (i.e. there is no longer a symmetrical sharing between the N transistors and the P transistors). Therefore, transistors M21, M22 are no longer used as simple source follower elements, as in the known technique, but they take part in the tuning of the delay, according to the process explained in the sequel.

In other terms, the invention causes the impedance of load transistors M2, M5 to vary in such a way as to cause a reduction of the delay. For such a purpose the control current lc is caused to increase by reducing said impedance. Further, to prevent the circuit gain from decreasing as the impedance of the load transistors decreases, current lp is increased so as to recover the gain constancy conditions. The increase in lp is increased so as to recover the gain constancy conditions. The increase in lp is further conducive to a reduction of the impedance and therefore of the delay.

Figure 2:
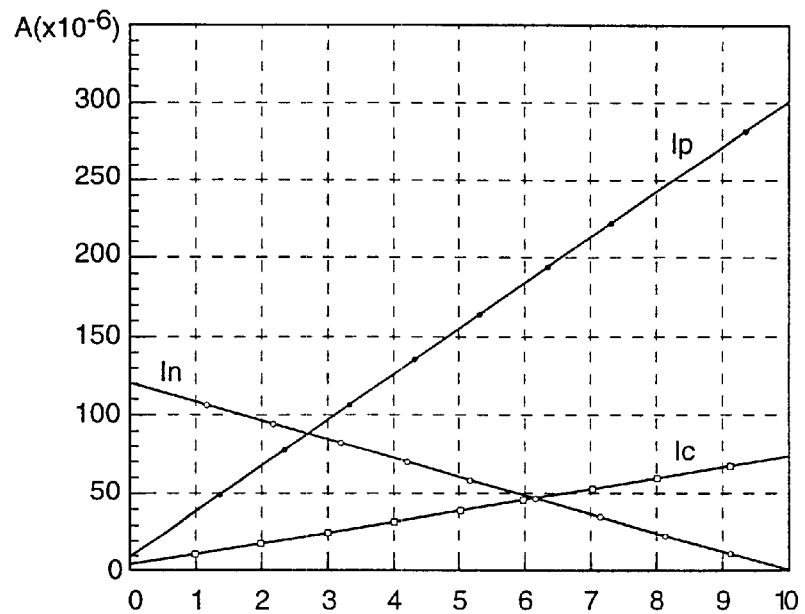
FIG. 2 is a diagram of the bias currents of the circuit, according to the invention.

The current values obtained through the bias modalities according to the invention exhibit the behavior depicted in FIG. 2. In FIG. 2, the ordinates show the value of lp, in, lc (in $\mu$A). The abscissa gives in arbitrary units the value of a control signal allowing the circuit in which the delay element is used to run over the whole tuning range (in the present case, a signal from which the three voltages Vp, Vn, Vc can be derived). The minimum abscissa corresponds to the maximum delay (and therefore to the lowest oscillation frequency, in the event of use in an oscillator).

Figure 3:
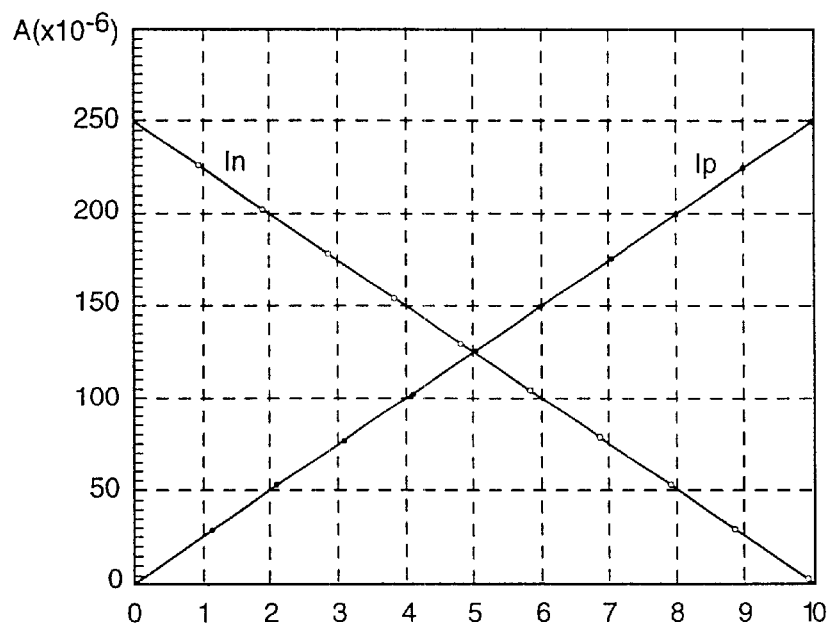
FIG. 3 is a diagram of the bias currents of the circuit as used according to known technique, given for comparison.

The diagram of FIG. 2 shows, if compared with the corresponding diagram of FIG. 3 relating to the known technique (where the sum of currents ln, lp and control current lc is constant) that the invention guarantees at least a considerable downward extension of the variability range of the delay (and therefore an upward extension of the range of frequency tunability), by virtue of the joint increase of lp and lc and therefore of the decrease of the impedance Z1 of the load transistors. As already previously stated, given the source follower connection between transistors M21 and M22 (or M22 and M5), the increase of current lc of transistors M21, M2 causes the increase in the gate-source voltage Vgs of transistors M2, M5: as a consequence, the transconductances of the same transistors increase, and their impedance Z1 decreases, and therefore the delay decreases. Since there is no longer the constraint imposed by the uniform sharing of lp and ln between the load transistors M2, M5 and the feedback transistors M21, M22, the increase in lp can occur more rapidly than the decrease in lp. The above situation occurs, provided the negative impedance Z2 is much higher in absolute value, and this is obtained for the reason that current ln in the feedback stage decreases as lc increases. A reduction in Z1 helps in keeping the stability condition (Z1<lZ21).

Furthermore, with reference to the application to a ring oscillator, which at present represents the preferred application, since the amplitude of the oscillations is given by the product of the total current flowing through the load transistor and the impedance of the same, it becomes evident that the increase in lc and the consequent decrease in Z1, ensure the constancy of amplitude of the oscillation as the frequency increases.

Suitable variation ranges for currents lc, ln, lp, can be the following:

lc: 3 to 10 μA as minimum value, 50 to 100 μA as maximum value;

lp: 5 to 15 μA as minimum value, 220 to 350 μA as maximum value;

ln: 90 to 150 μA as maximum value, O μA as minimum value.

Tests performed on a ring oscillator using four delay elements biased according to the invention have proven that the tunability range which can be guaranteed has an amplitude equal to 6–7 times the minimum frequency, thus much higher than the one which can be obtained according to the known technique. In practical exemplary embodiments, minimum frequencies between approximately 0.22 GHz (fast N transistors and typical P transistors) and approximately 0.4 GHz (typical N transistors and fast P transistors, or slow N transistors and typical P transistors), and maximum frequencies between approximately 2 GHz (slow N and P transistors) and approximately 3 GHz (typical N transistors and fast P transistors) have been achieved. For comparison, an identical oscillator using delay elements according to the known technique exhibited minimum frequencies between 0.5 GHz and 1 GHz and maximum frequencies between 1.1 GHz and 1.6 GHz. These tests prove that the invention allows not only the up-extension of the frequency tunability range in an oscillator in which is adopted, as shown in FIG. 2, but also an extension in the opposite direction.

As a matter of fact, in the lower part of the tunability range, the transistors M21, M22 mounted according to the known technique (i.e. as sheer source follower elements) were biased statically as a trade-off between the maximum delay and the minimum delay obtainable, whereas according to the invention the bias variation according to the method already illustrated, allows its contribution to the tunability range, which is therefore extended both upwards and downwards.

What is claimed is:

1. A method of extending the tunability range of a CMOS delay element based on a differential amplifier (M15, M8, M2, M6, M5) comprising a load, wherein said load comprises:

load transistors (M2, M5) having a positive impedance, a first type of doping and being associated to respective biasing transistors (M21, M22), having a second type of doping and being connected in a source follower configuration to said load transistors (M2, M5); and feedback transistors (M3, M4) having the second type of doping and forming a negative impedance in parallel to said positive impedance formed by each of the load transistors (M2, M5), said load transistors (M2, M5) and said feedback transistors (M3, M4) being biased by respective currents (lp, ln) variable in opposite directions upon variation of the delay to be introduced, wherein the transistors connected in source follower configurations are biased by a bias current (lc) that is also made to vary so as to cause a variation in the positive impedance of the load transistors (M2, M5), and the bias current (lp) of the load transistors (M2, M5) is made to vary in such a way as to reach a maximum value higher than the maximum value of the bias current (ln) of the feedback transistors (M3, M4), so that the sum of said bias currents (lp, ln) of the load transistors (M2, M5) and the feedback transistors (M3, M4) increases in a substantially linear way as the delay to be introduced decreases and vice versa.

2. A CMOS delay element, comprising a differential amplifier (M15, M8, M2, M6, M5) having a load wherein said load comprises a pair of load transistors (M2, M5) having a positive impedance, a first type of doping, and being associated to respective gate biasing transistors (M21, M22) connected in a source follower configuration and having a second type of doping; and feedback transistors (M3, M4), having the second type of doping and forming a negative impedance in parallel to said positive impedance represented by each of the load transistors (M2, M5); and wherein said load transistors (M2, M5) and said feedback transistors (M3, M4) are associated to respective generators of control voltages (Vp, Vn) such as to allow flowing, through said transistors, respective bias currents (Ip, In) which vary in order to achieve the variation of the delay to be introduced by the element, wherein said transistors (M21, M22) biasing the gates of the load transistors (M2, M5) are associated to a generator of control voltage (Vc), arranged to make flow in said bias transistors (M21, M22) a bias current (Ic) which is linearly variable increasing in order to reduce or respectively increase the impedance of the load transistors (M2, M5), and in that said generators of control voltages (Vp, Vn) for said load transistors (M2, M5) and said feedback transistors (M3, M4) are arranged to make flow in such transistors bias currents (Ip, In) such that the bias current (Ip) of the load transistors (M2, M5) rises up to a maximum value higher than the maximum value of the bias current (Ip, In) of the load transistors (M2, M5) and feedback transistors M3, M4) increases in a substantially linear way as the delay to be introduced decreases and vice versa.

3. The delay line composed of CMOS delay elements as defined in claim 2.

* * * * *